US012672307B2

(12) United States Patent
Eng et al.

(10) Patent No.: US 12,672,307 B2
(45) Date of Patent: Jun. 30, 2026

(54) FINFET DEVICE WITH EXTRA BODY PORTION AND METHOD OF FORMING THE SAME

(71) Applicant: United Microelectronics Corp., Hsinchu (TW)

(72) Inventors: Yi Chuen Eng, Tainan City (TW); Tzu-Feng Chang, Tainan City (TW); Teng-Chuan Hu, Tainan City (TW); Yi-Wen Chen, Tainan City (TW); Yu-Hsiang Lin, New Taipei City (TW)

(73) Assignee: United Microelectronics Corp., Hsinchu (TW)

( * ) Notice: Subject to any disclaimer, the term of this patent is extended or adjusted under 35 U.S.C. 154(b) by 540 days.

(21) Appl. No.: 17/964,925

(22) Filed: Oct. 13, 2022

(65) Prior Publication Data
US 2024/0097038 A1 Mar. 21, 2024

(30) Foreign Application Priority Data
Sep. 16, 2022 (TW) .................................. 111135248

(51) Int. Cl.
| | |
|---|---|
| *H10D 30/62* | (2025.01) |
| *H10D 30/01* | (2025.01) |
| *H10D 62/13* | (2025.01) |
| *H10D 84/01* | (2025.01) |
| *H10D 84/03* | (2025.01) |

(52) U.S. Cl.
CPC ....... *H10D 30/6211* (2025.01); *H10D 30/024* (2025.01); *H10D 62/151* (2025.01); *H10D 84/013* (2025.01); *H10D 84/0151* (2025.01); *H10D 84/0158* (2025.01); *H10D 84/038* (2025.01)

(58) Field of Classification Search
CPC ............. H10D 30/6211; H10D 30/024; H10D 62/151; H10D 84/013; H10D 84/0151; H10D 84/0158; H10D 84/038
See application file for complete search history.

(56) References Cited

U.S. PATENT DOCUMENTS

| | | | |
|---|---|---|---|
| 11,024,712 B2 | 6/2021 | Jovanov et al. | |
| 2004/0036112 A1* | 2/2004 | Hsieh ................... | H10D 30/681 |
| | | | 257/317 |
| 2018/0012967 A1* | 1/2018 | Kang ................... | H10D 84/856 |
| 2019/0267491 A1* | 8/2019 | Yeh ........................ | H10D 30/62 |
| 2021/0391460 A1* | 12/2021 | Chuang ............... | H10D 62/117 |
| 2022/0199828 A1* | 6/2022 | Mehrotra ............. | H10D 84/834 |

FOREIGN PATENT DOCUMENTS

WO 2019005087 1/2019

* cited by examiner

*Primary Examiner* — Eric W Jones
*Assistant Examiner* — Sammantha K Salaz
(74) *Attorney, Agent, or Firm* — JCIPRNET

(57) ABSTRACT

A semiconductor device, including a substrate, a first source/drain region, a second source/drain region, and a gate structure, is provided. The substrate has an extra body portion and a fin protruding from a top surface of the substrate, wherein the fin spans the extra body portion. The first source/drain region and the second source/drain region are in the fin. The gate structure spans the fin, is located above the extra body portion, and is located between the first source/drain region and the second source/drain region.

19 Claims, 19 Drawing Sheets

FINFET DEVICE WITH EXTRA BODY PORTION AND METHOD OF FORMING THE SAME

CROSS-REFERENCE TO RELATED APPLICATION

This application claims the priority benefit of Taiwan application serial no. 111135248, filed on Sep. 16, 2022. The entirety of the above-mentioned patent application is hereby incorporated by reference herein and made a part of this specification.

BACKGROUND

Technical Field

The disclosure relates to an integrated circuit and a method of fabricating the same, and particularly relates to a semiconductor device and a method of fabricating the same.

Description of Related Art

With the rapid development of semiconductor process technology, in order to improve the speed and performance of the device, the size of the entire circuit device must be continuously reduced, and the degree of integration of the device must be continuously improved. Generally speaking, under the design development of the semiconductor tending to shrink the circuit device, the length of the channel region of the transistor also tends to be gradually shortened, so as to speed up the operation speed of the device. However, it is easy to cause issues such as a serious leakage current, a short channel effect, and drop of a turn-on current in the transistor.

In order to overcome the above issues, the multi-gate structure has been proposed in the industry in recent years, which uses gates to enclose the channel region, so that the entire channel region is affected by the gate electric field, thereby increasing the turn-on current of the device and reducing the leakage current. The fin-type field effect transistor (FinFET) is a common transistor with the multi-gate structure. However, since the fin-type transistor has a three-dimensional structure, which is more complicated than the traditional structure, there are often issues of an insufficient driving current or causing the leakage current.

SUMMARY

A semiconductor device according to an embodiment of the disclosure can increase a driving current, reduce an electric field, and reduce a leakage current.

A method of fabricating a semiconductor device according to an embodiment of the disclosure may be integrated with a conventional process.

A semiconductor device according to an embodiment of the disclosure includes a substrate, a first source/drain region, a second source/drain region, and a gate structure. The substrate has an extra body portion and a fin protruding from a top surface of the substrate. The fin spans the extra body portion. The first source/drain region and the second source/drain region are in the fin. The gate structure spans the fin, is located above the extra body portion, and is located between the first source/drain region and the second source/drain region.

A method of fabricating a semiconductor device according to an embodiment of the disclosure includes the following steps. A protruding portion and a fin are formed on a substrate, the protruding portion and the fin protrude from a top surface of the substrate, and the fin spans the protruding portion. A first source/drain region and a second source/drain region are formed on the fin. A gate structure is formed and spans the fin. The gate structure is located above the protruding portion and is located between the first source/drain region and the second source/drain region.

A semiconductor device according to an embodiment of the disclosure has an extra body portion to increase the driving current and has a doped region in a drift region to reduce the electric field, thereby reducing the leakage current.

A method of fabricating a semiconductor device having an extra body portion and a doped region according to an embodiment of the disclosure may be integrated with the conventional process.

DETAILED DESCRIPTION OF DISCLOSED EMBODIMENTS

Figure 1A:
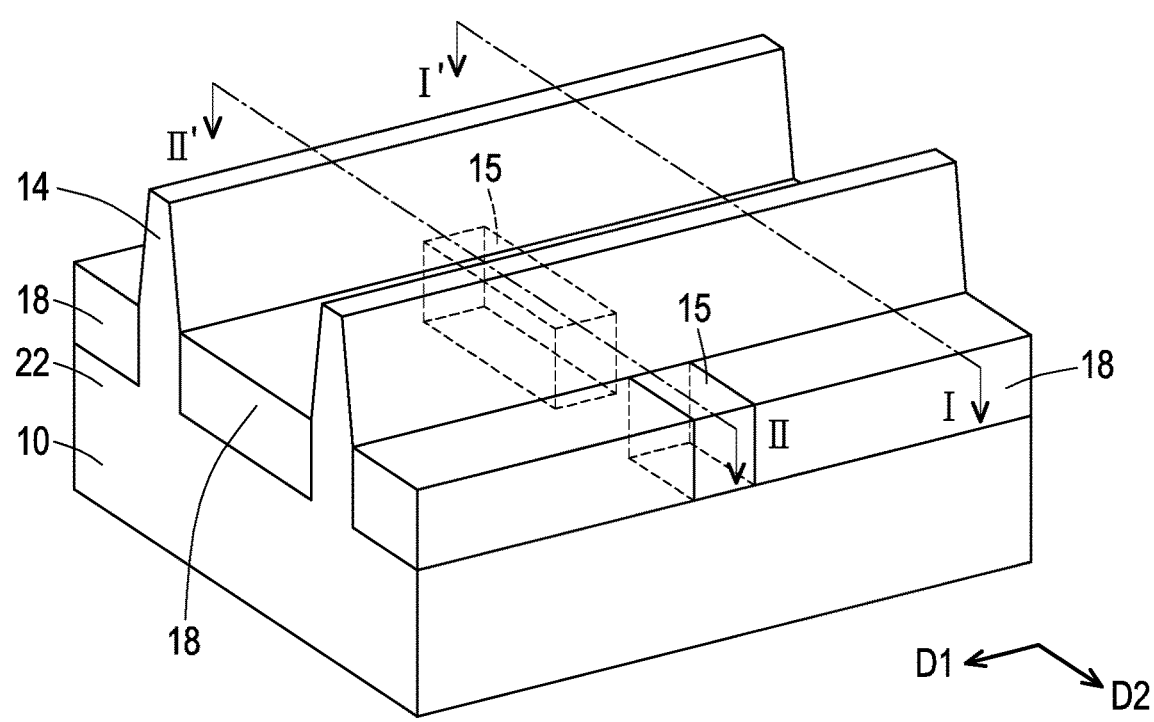
FIG. 1A to FIG. 1E are schematic perspective views of a method of fabricating a semiconductor device according to an embodiment of the disclosure.

FIG. 1A is a schematic perspective view of an intermediate stage of a method of fabricating a semiconductor device according to an embodiment of the disclosure. FIG. 2A to FIG. 2F are top views of the semiconductor device of FIG. 1A at each stage of manufacture. FIG. 3A to FIG. 3F are cross-sectional views along a line I-I' of FIG. 1A and FIG. 2A to FIG. 2F. FIG. 4A to FIG. 4F are cross-sectional views along a line II-II' of FIG. 1A and FIG. 2A to FIG. 2F.

Please refer to FIG. 1A. Multiple fins 14 and a protruding portion 15 are formed on a substrate 10, and an isolation structure 18 is formed around the fins 14 and the protruding portion 15. An extending direction D2 of the protruding portion 15 is different from an extending direction D1 of the fins 14, such as being perpendicular to each other. The height of the protruding portion 15 is lower than the height of the fins 14. The material of the protruding portion 15 may be the same or different from the material of the fins 14. The materials of the protruding portion 15 and the fins 14 may be the same or different from the material of the substrate 10. In some embodiments, the protruding portion 15 and the fins 14 are formed by patterning the substrate 10, and the detailed process thereof is described in FIG. 2A to FIG. 2F, FIG. 3A to FIG. 3F, and FIG. 4A to FIG. 4F.

Figure 2A:
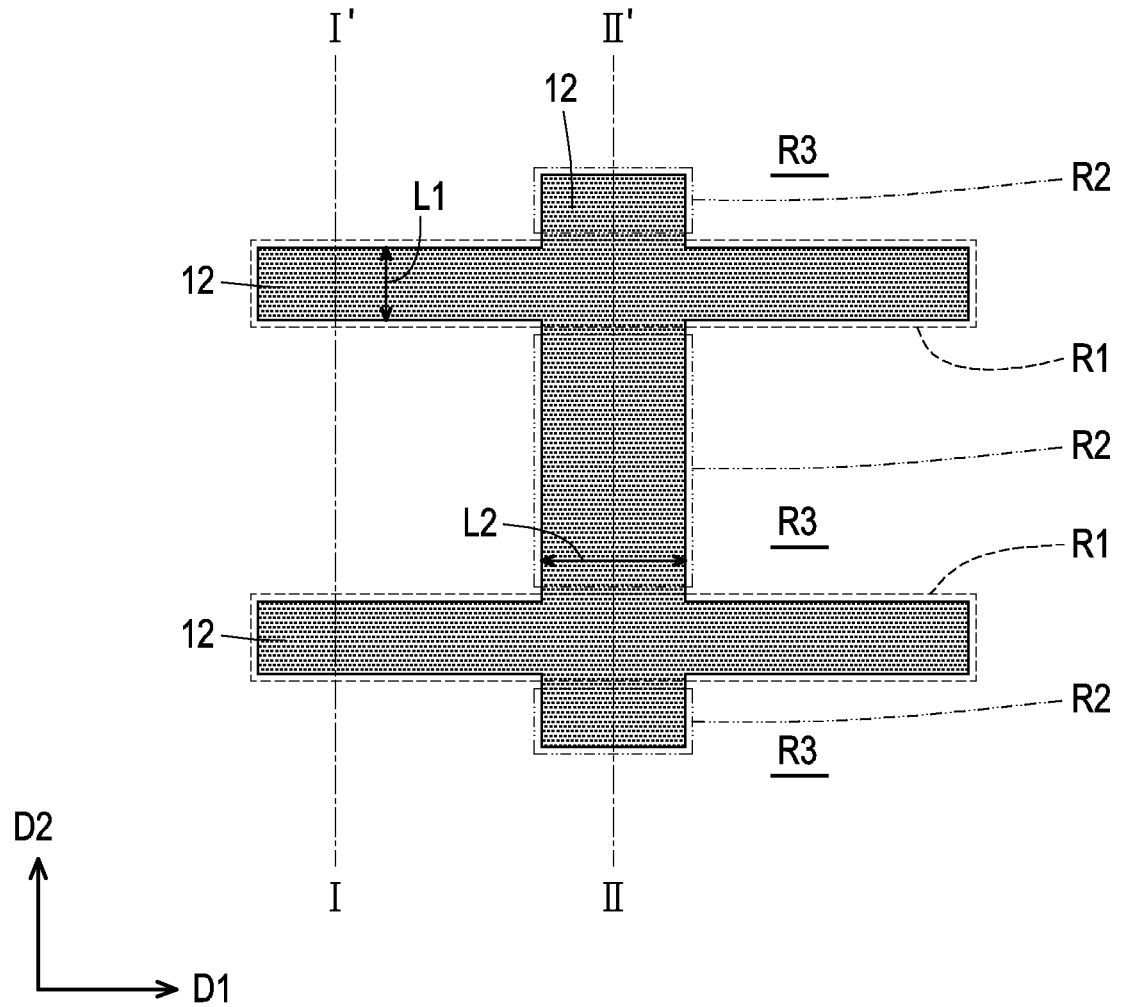
FIG. 2A to FIG. 2F are top views of the semiconductor device of FIG. 1A at each stage of manufacture.
Figure 2F:
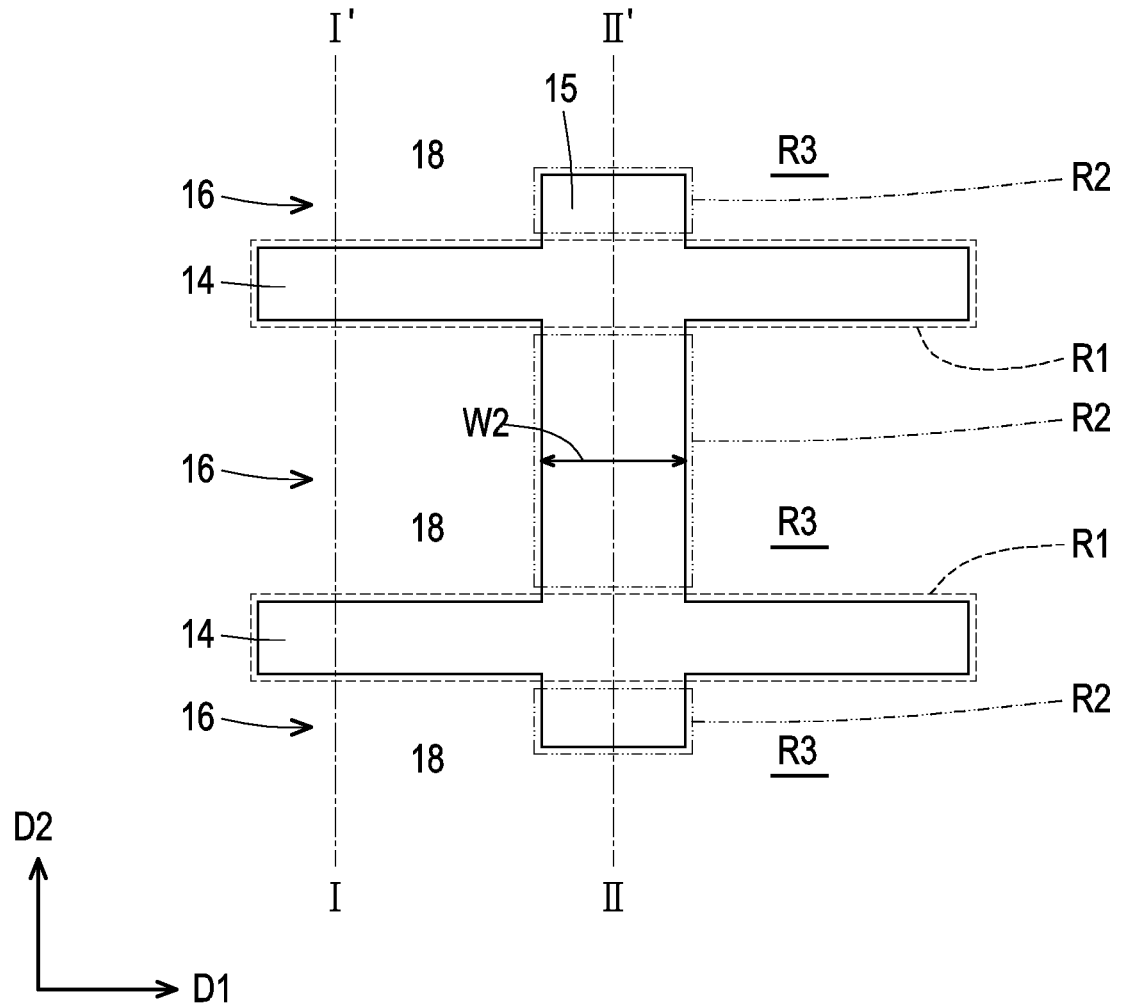
Figure 3A:
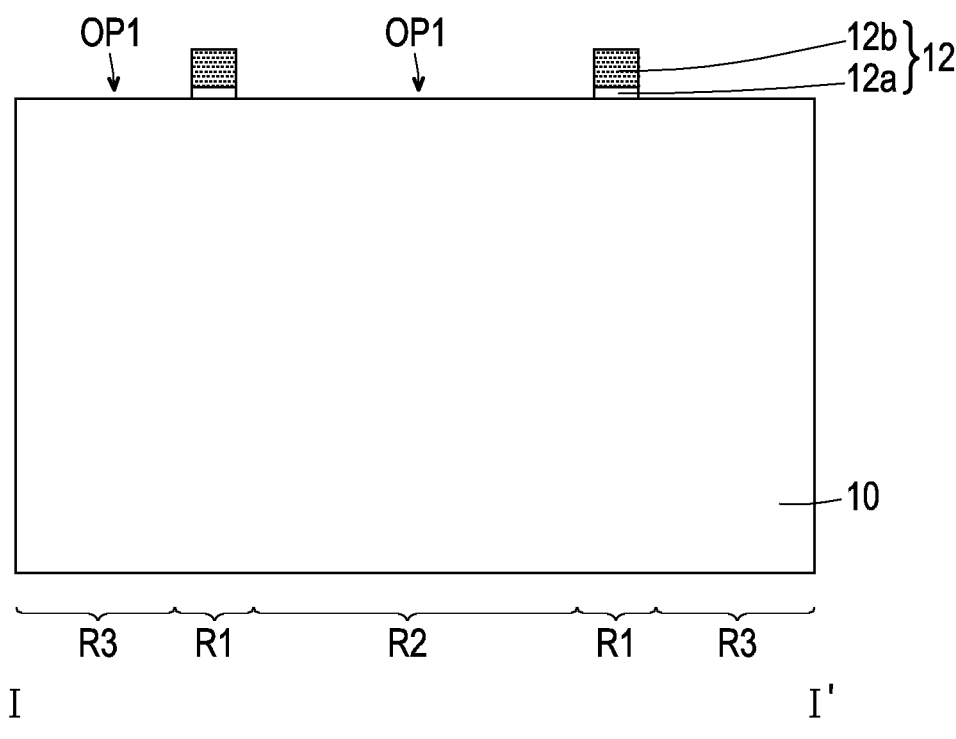
FIG. 3A to FIG. 3F are cross-sectional views along a line I-I' of FIG. 1A and FIG. 2A to FIG. 2F.
Figure 3B:
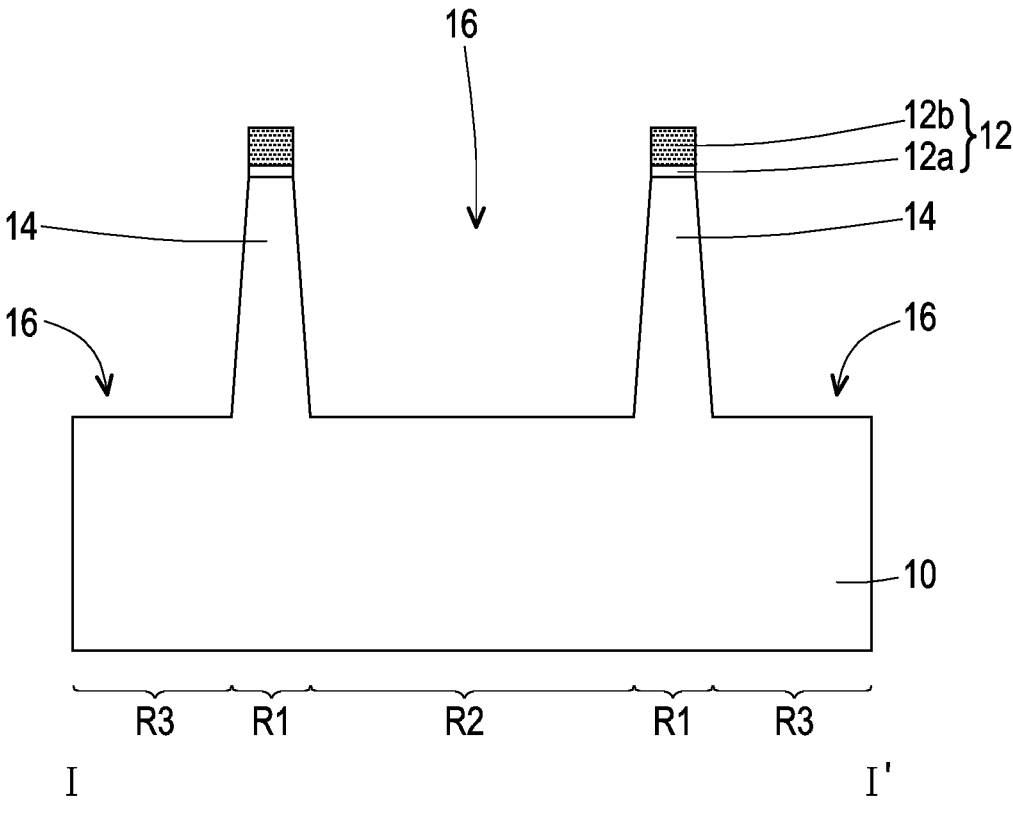
Figure 4A:
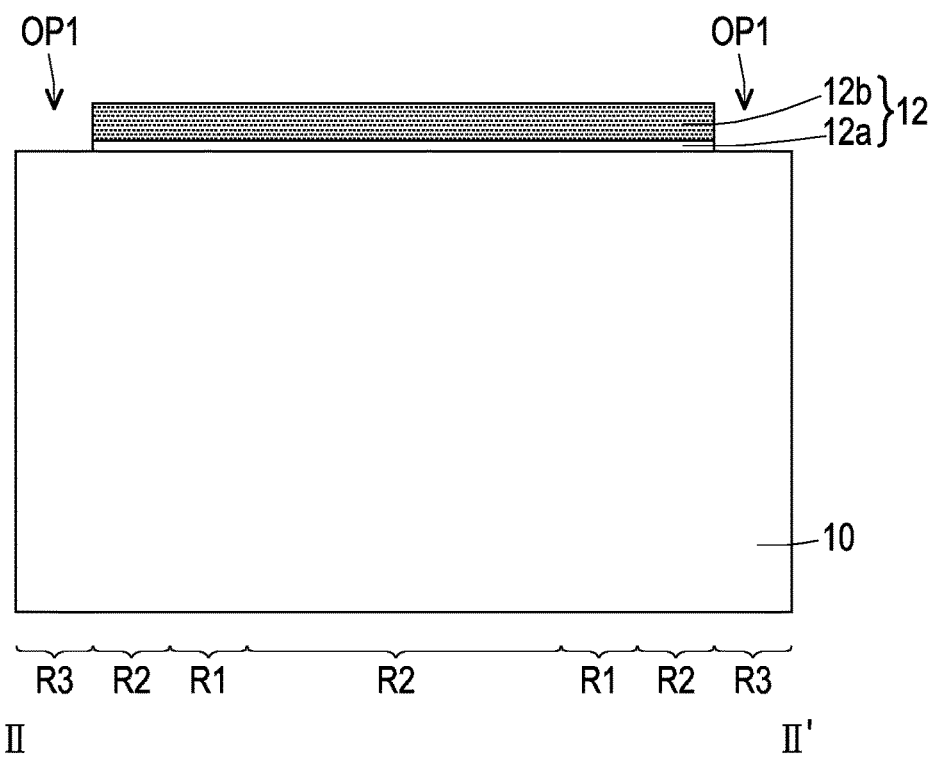
FIG. 4A to FIG. 4F are cross-sectional views along a line II-II' of FIG. 1A and FIG. 2A to FIG. 2F.

Referring to FIG. 2A, FIG. 3A, and FIG. 4A, the substrate 10 is provided. The material of the substrate 10 includes a semiconductor, such as silicon. A hard mask layer 12 is formed on the substrate 10. The hard mask layer 12 covers the substrate 10 in a region R1 and a region R2. The hard mask layer 12 has an opening OP1 to expose the surface of the substrate 10 in a region R3. The hard mask layer 12 may be composed of a single material layer or more than two material layers. In some embodiments, the hard mask layer 12 is composed of, for example, a silicon oxide layer 12a and a silicon nitride layer 12b (from bottom to top). A method of forming the hard mask layer 12 is, for example, forming a silicon oxide material and a silicon nitride material by chemical vapor deposition, and then patterning using lithography and an etching process to form the silicon oxide layer 12a and the silicon nitride layer 12b. A width L1 of the hard mask layer 12 in the region R1 may be greater than or equal to the width of the top of the fin 14 to be formed (shown in FIG. 3B). A width L2 of the hard mask layer 12 in the region R2 may enable a width W2 of the protruding portion 15 to be formed (as shown in FIG. 2F) to be equal to or greater than a width W1 of a gate conductor layer 34 of a gate structure 40 (as shown in FIG. 5D).

Figure 2B:
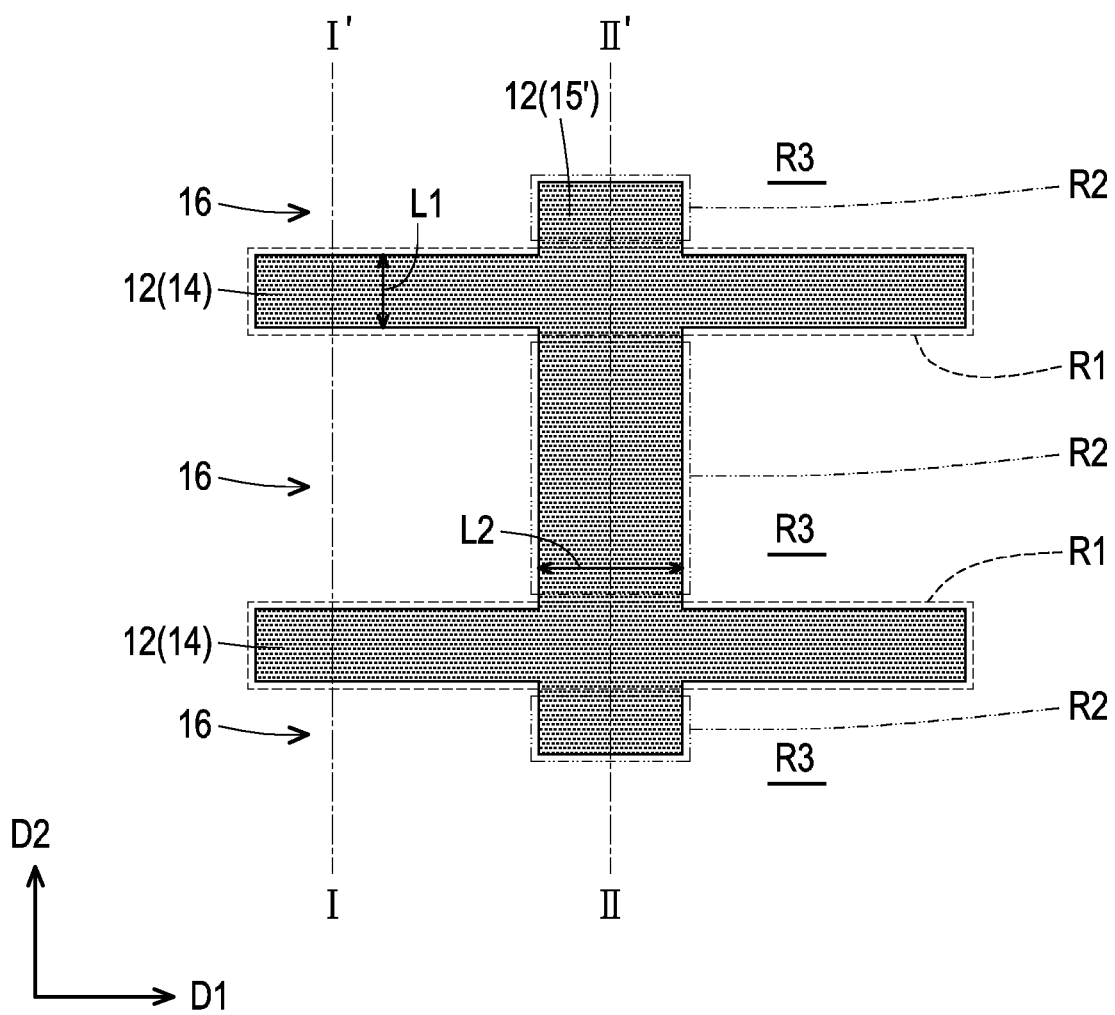
Figure 4B:
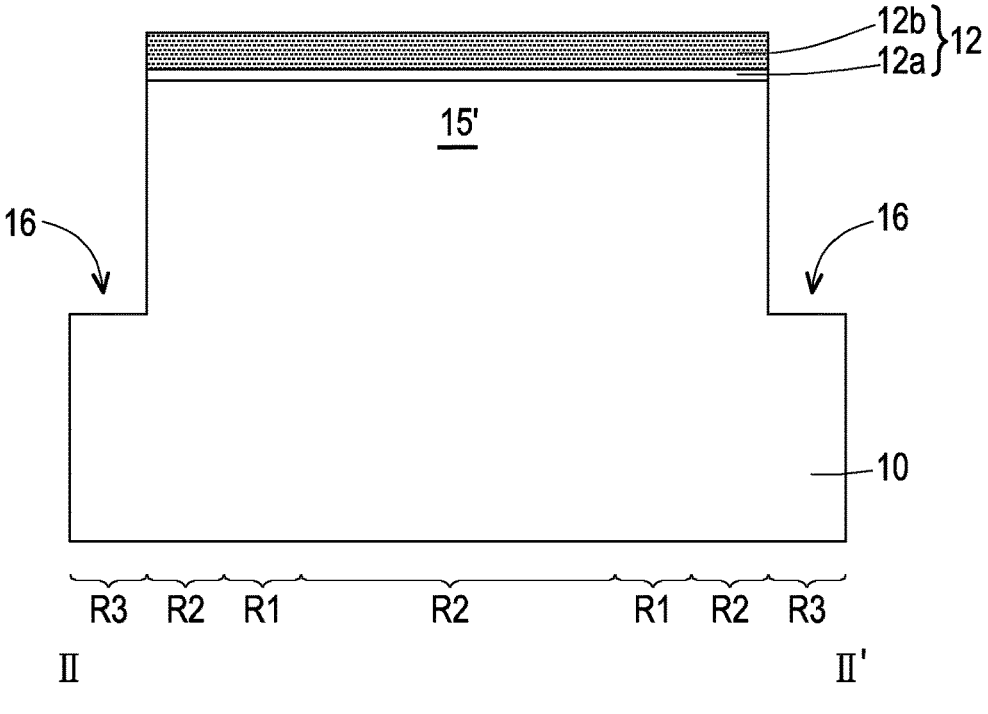

Next, please refer to FIG. 2B, FIG. 3B, and FIG. 4B, an etching process, such as an anisotropic etching process, is performed to remove the substrate 10 exposed by the opening OP1 to form multiple trenches 16 and form the fins 14 and a hybrid portion 15' between the adjacent trenches 16. The fins 14 are in the region R1, and the hybrid portion 15' is in the region R2 and a part of the region R1. An extending direction D2 of the hybrid portion 15' is different from the extending direction D1 of the fins 14, such as being perpendicular to each other.

Figure 2C:
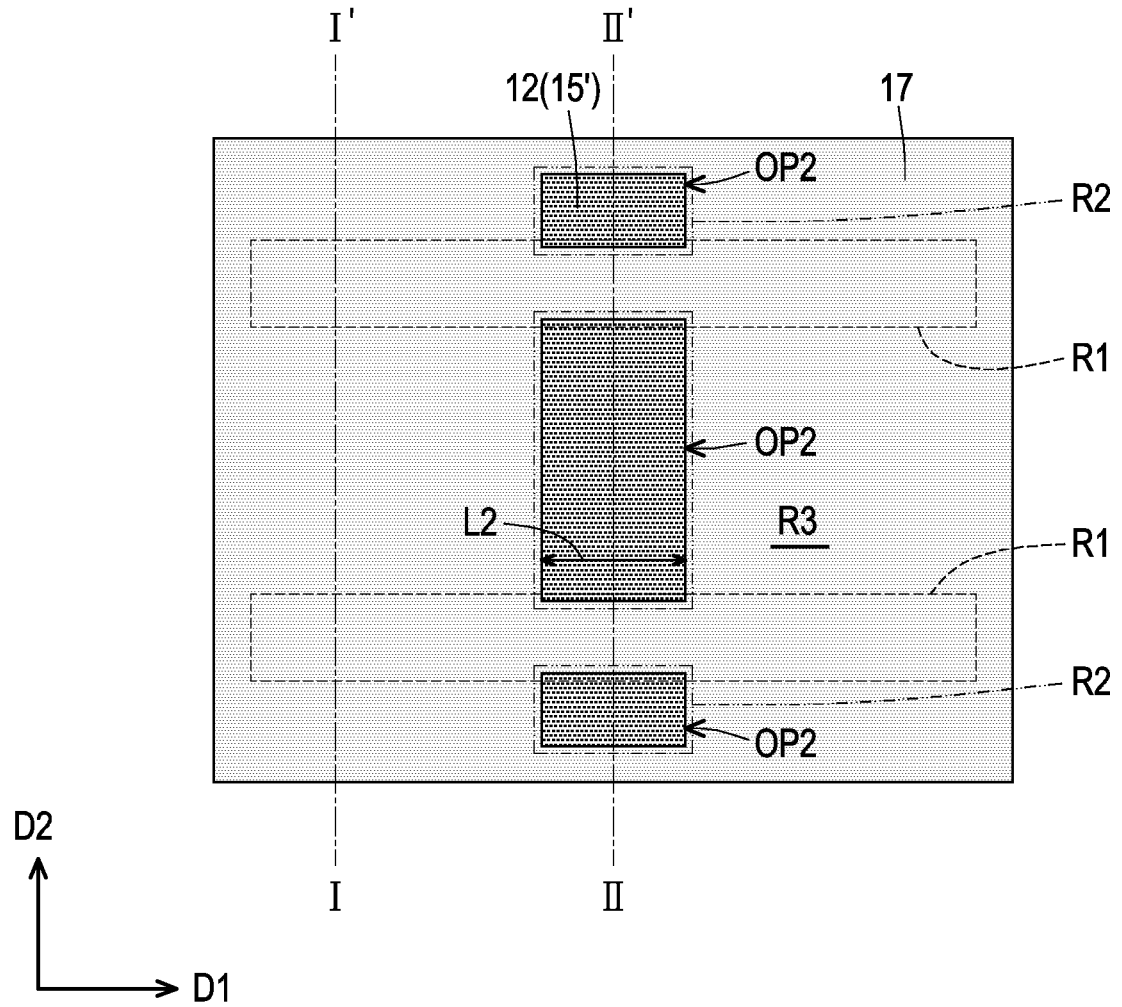
Figure 3C:
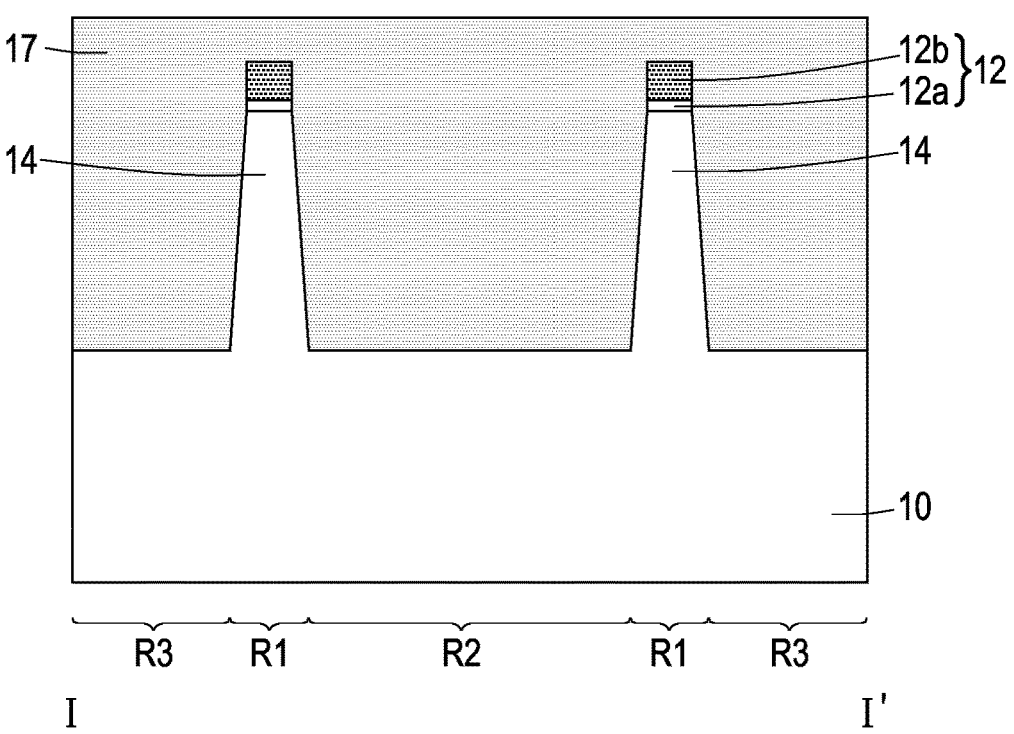
Figure 4C:
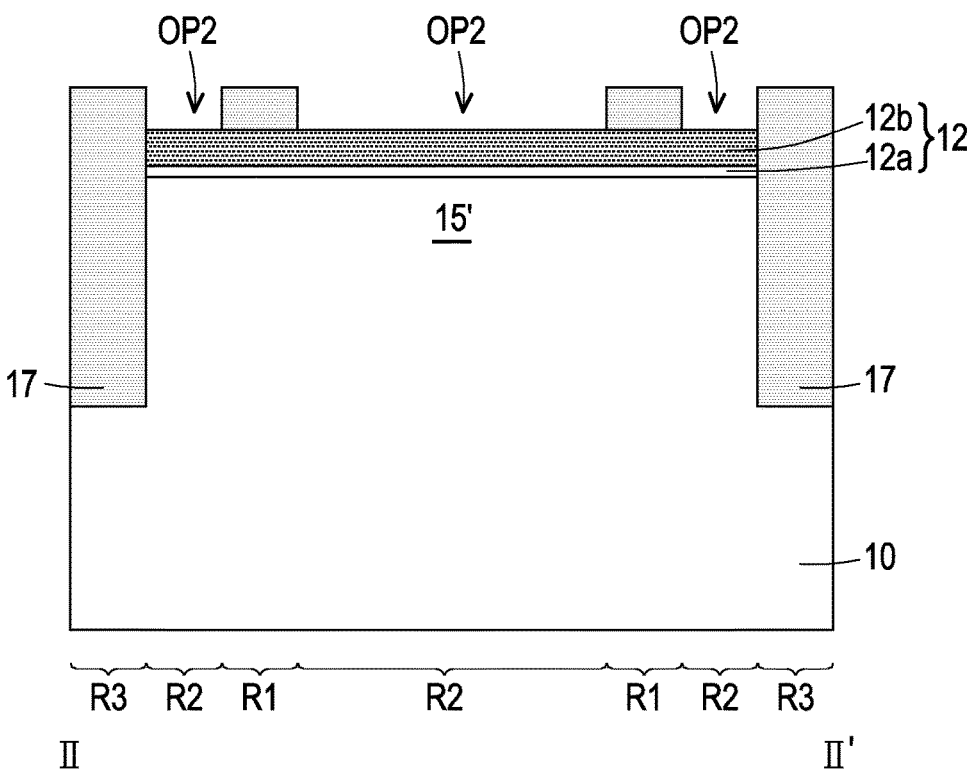

Please refer to FIG. 2C, FIG. 3C, and FIG. 4C. A mask layer 17 is formed above the substrate 10. The mask layer 17 covers the region R1 and covers the region R2 and the region R3. The mask layer 17 has an opening OP2 to expose the mask layer 12 in the region R2. The mask layer 17 is, for example, a patterned photoresist layer.

Figure 2D:
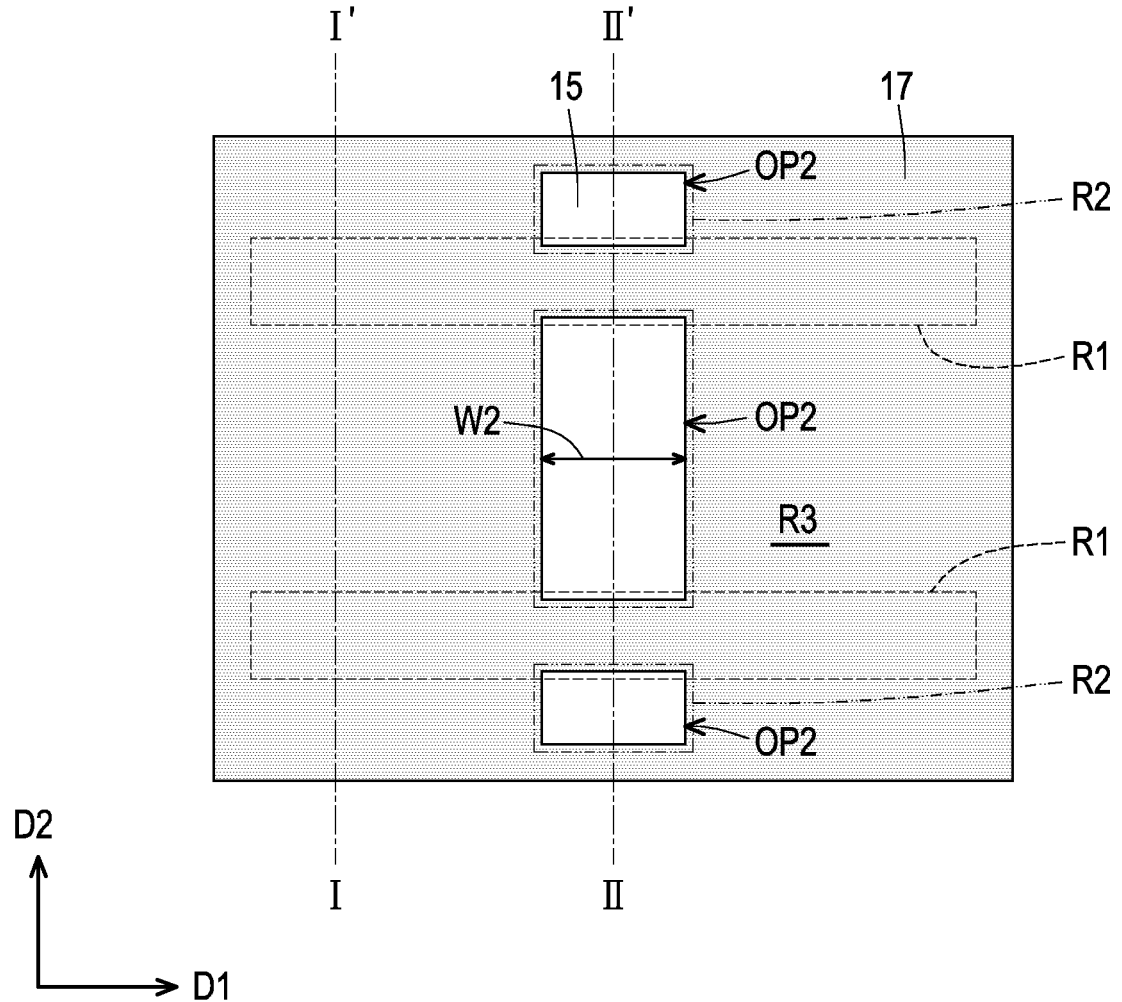
Figure 3D:
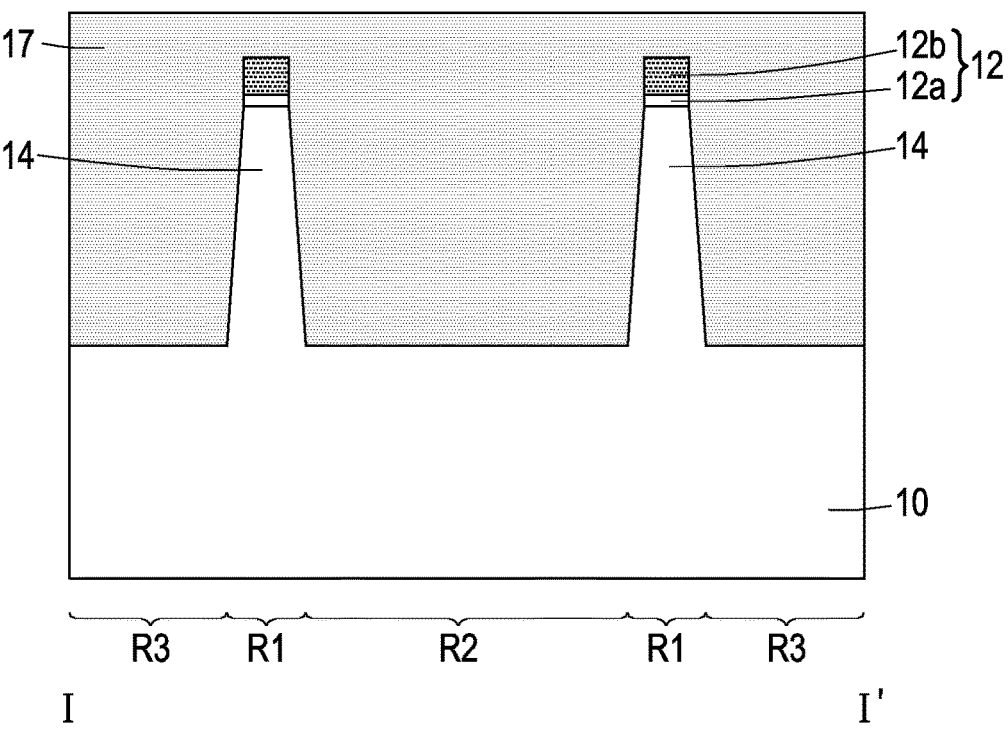
Figure 4D:
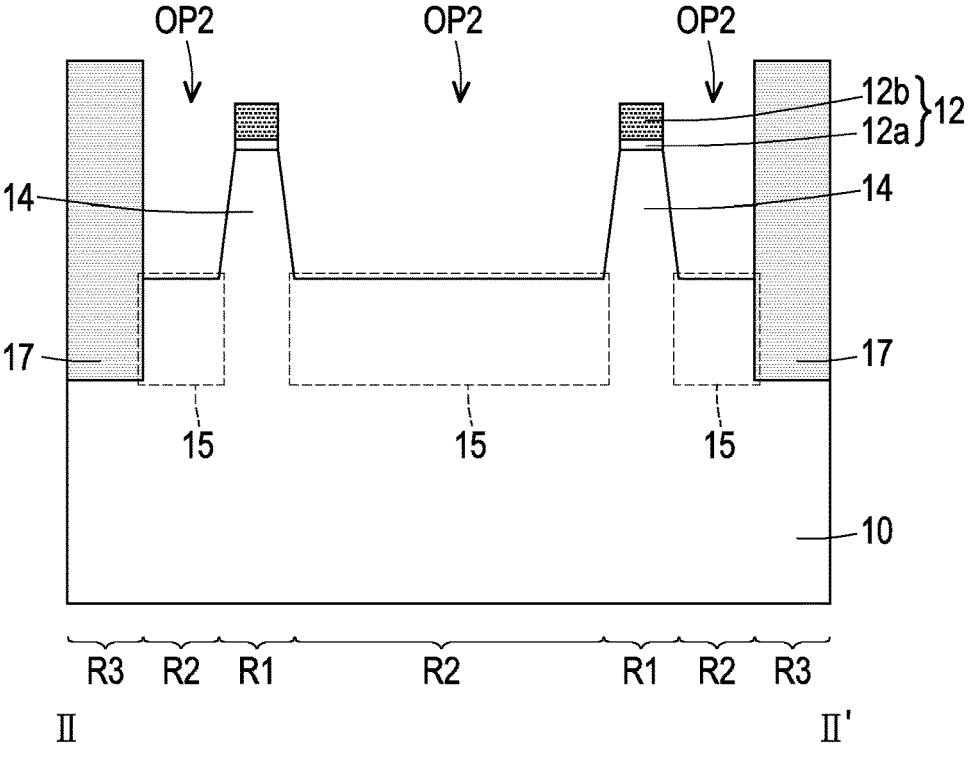

Referring to FIG. 2D, FIG. 3D, and FIG. 4D, the mask layer 12 exposed by the opening OP2 and a part of the hybrid portion 15' below the same are removed using the mask layer 17 as an etching mask to form multiple protruding portions 15. So far, the fins 14 and the protruding portions 15 are formed. The fins 14 are formed in the region R1 of the substrate 10. The protruding portion 15 is formed in the region R2 of the substrate 10. In the embodiment, the fins 14 respectively extend along the direction D1 and are disposed parallel to each other. The protruding portions 15 respectively extend along the direction D2 and are arranged in a line. The protruding portions 15 are on two sides of each fin 14 with ends being connected to the fin 14. The fins 14 extend and protrude from the top surfaces of the protruding portions 15. The width W2 of the protruding portion 15 may be greater than, equal to, or less than the width of the fin 14. The fin 14 may be narrow at the top and wide at the bottom (as shown in FIG. 3D) or have the same width at the top and the bottom (not shown).

Figure 2E:
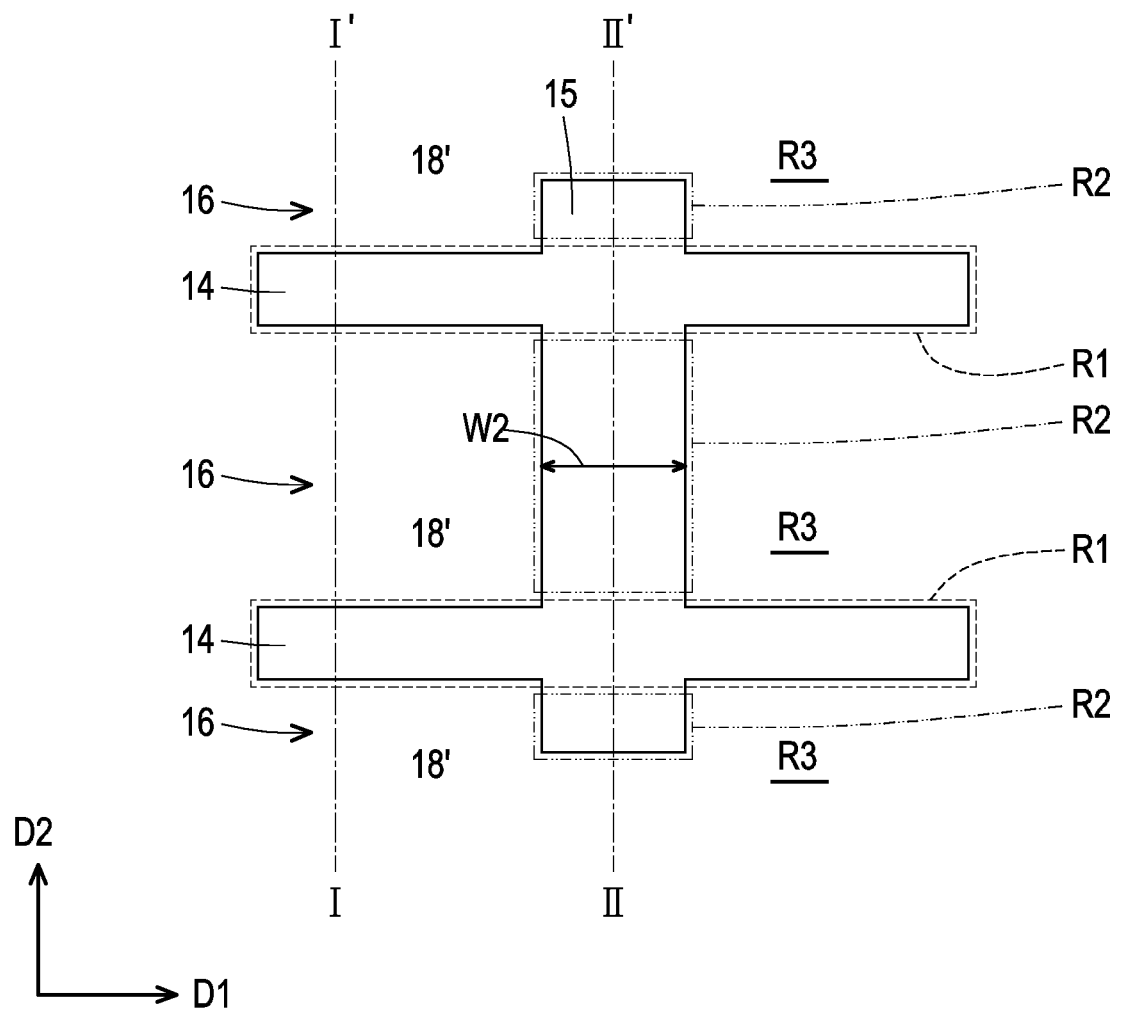
Figure 3E:
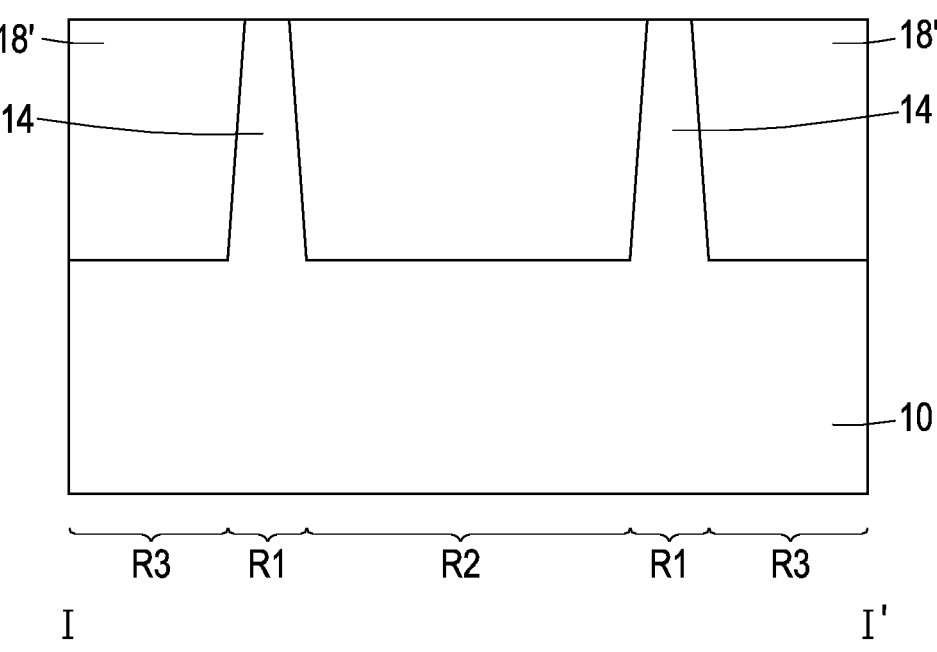
Figure 4E:
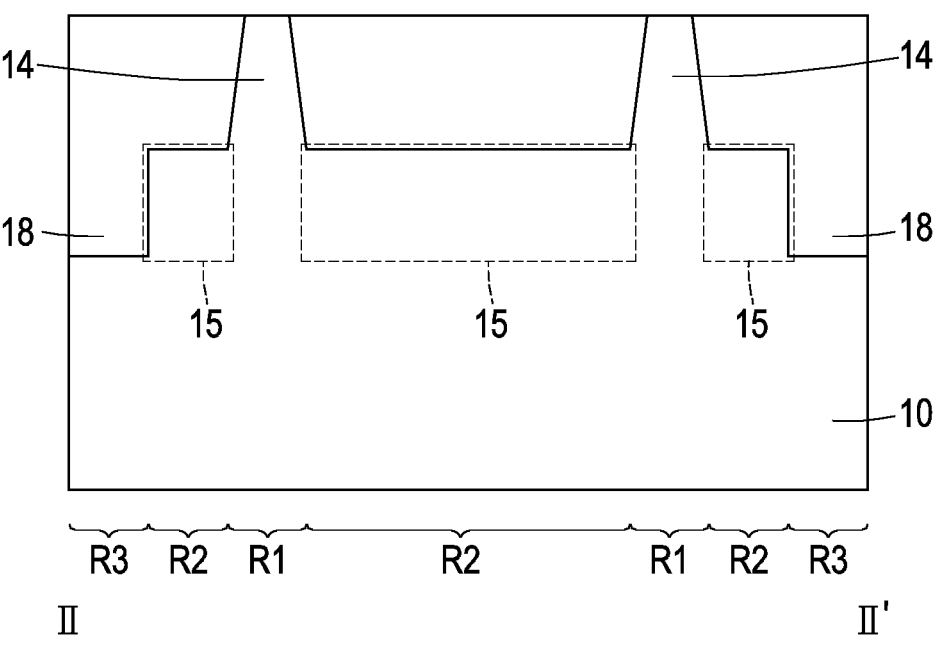

Referring to FIG. 2E, FIG. 3E, and FIG. 4E, the mask layer 17 is removed. For example, the mask layer 17 may be stripped dry, wet, or both. After that, an insulating material is formed in the trench 16 and on the protruding portions 15. The insulating material may be a single layer or multiple layers. An insulating layer material includes silicon oxide, silicon nitride, or a combination thereof. After that, planarization, such as chemical mechanical polishing, is performed on the insulating layer material to form an insulating layer 18' in the trench 16 and on the top surfaces of the protruding portions 15.

Figure 3F:
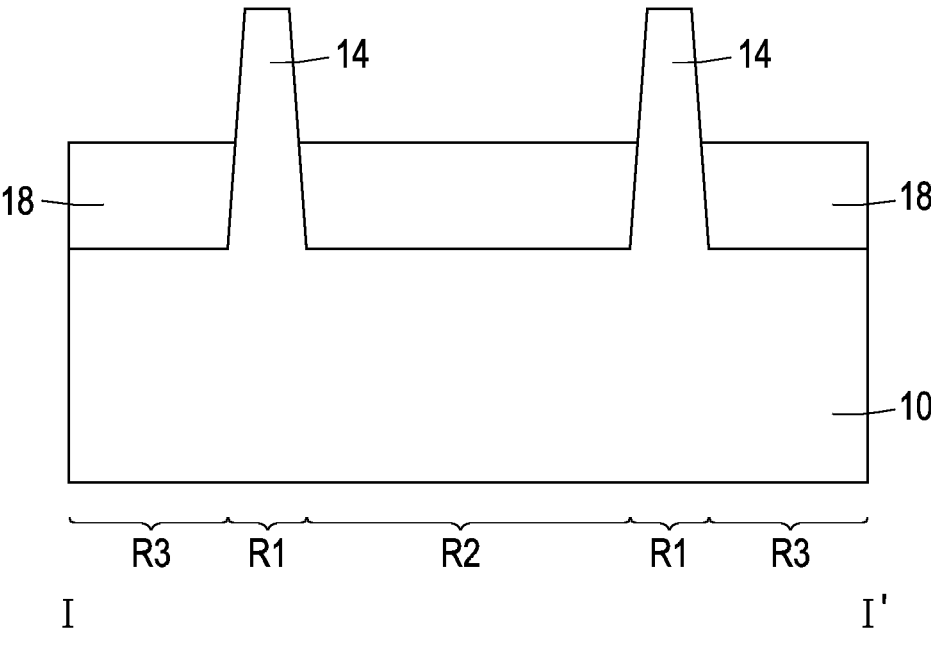
Figure 4F:
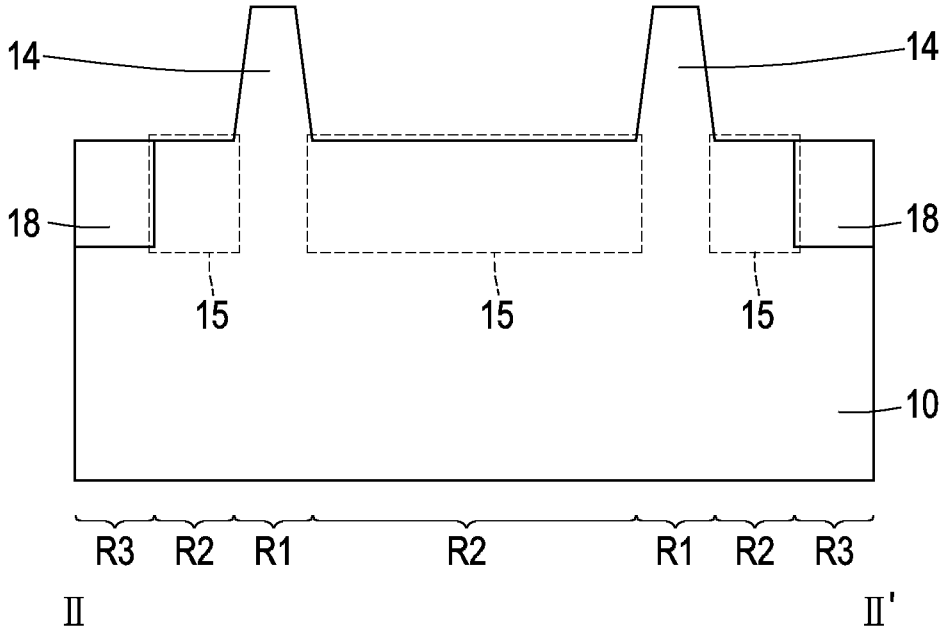

Referring to FIG. 2F, FIG. 3F, and FIG. 4F, the insulating layer 18' is etched back to form the isolation structure 18. The isolation structure 18 is located in the trench 16. The isolation structure 18 surrounds the fins 14 and the protruding portions 15. In other words, the protruding portions 15 are embedded in the isolation structure 18. The isolation structure 18 does not cover the protruding portions 15, so that the top surfaces of the protruding portions 15 are exposed. In some embodiments, a top surface of the isolation structure 18 is substantially coplanar with the top surfaces of the protruding portions 15. So far, an intermediate structure of the semiconductor device shown in FIG. 1A is completed.

FIG. 1B to FIG. 1E are schematic perspective views of an intermediate stage of a method of fabricating a semiconductor device according to an embodiment of the disclosure. FIG. 5A to FIG. 5D are cross-sectional views along a line III-III' of FIG. 1B to FIG. 1E. FIG. 6A to FIG. 6D are cross-sectional views along a line II-II' of FIG. 1B to FIG. 1E.

Figure 1B:
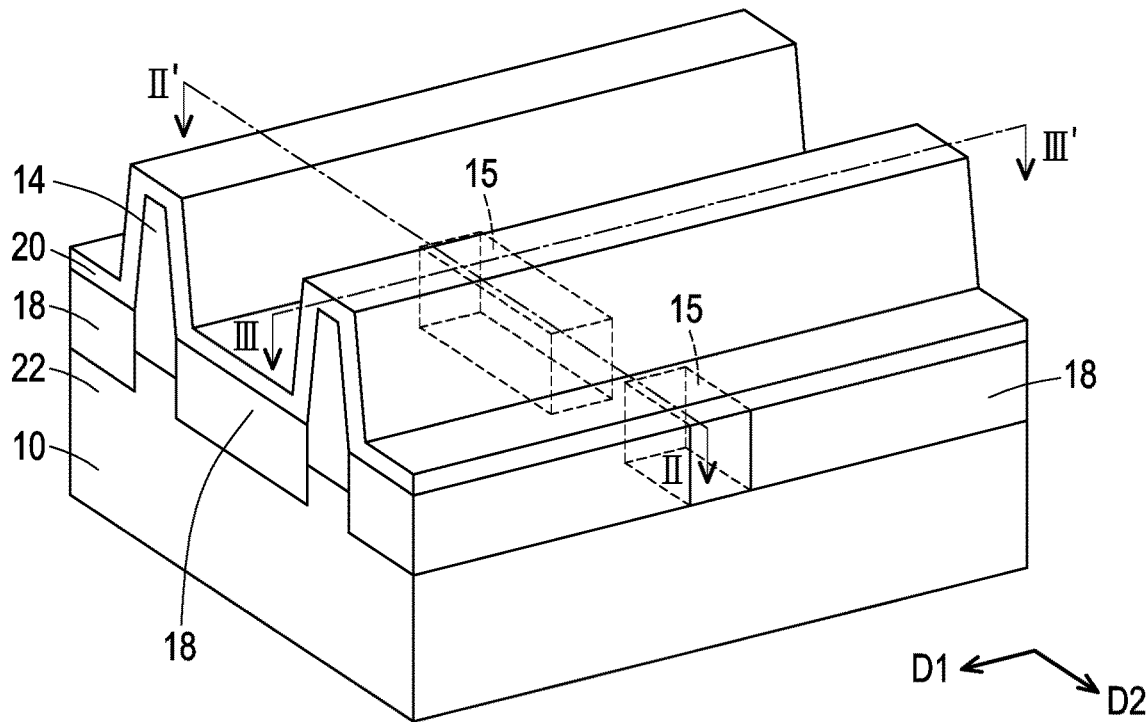
Figure 5A:
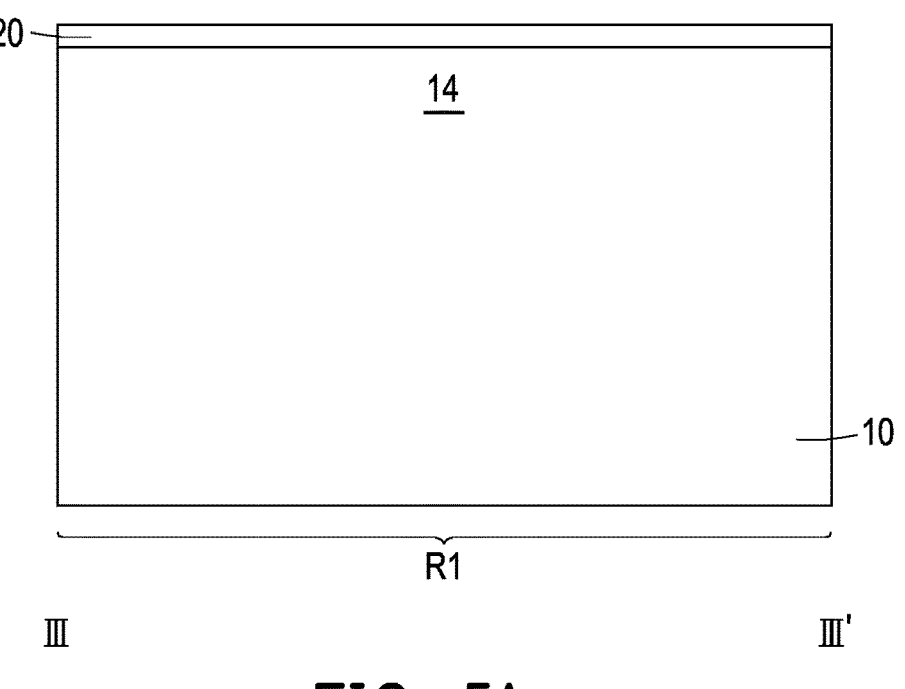
FIG. 5A to FIG. 5D are cross-sectional views along a line III-III' of FIG. 1B to FIG. 1E.
Figure 6A:
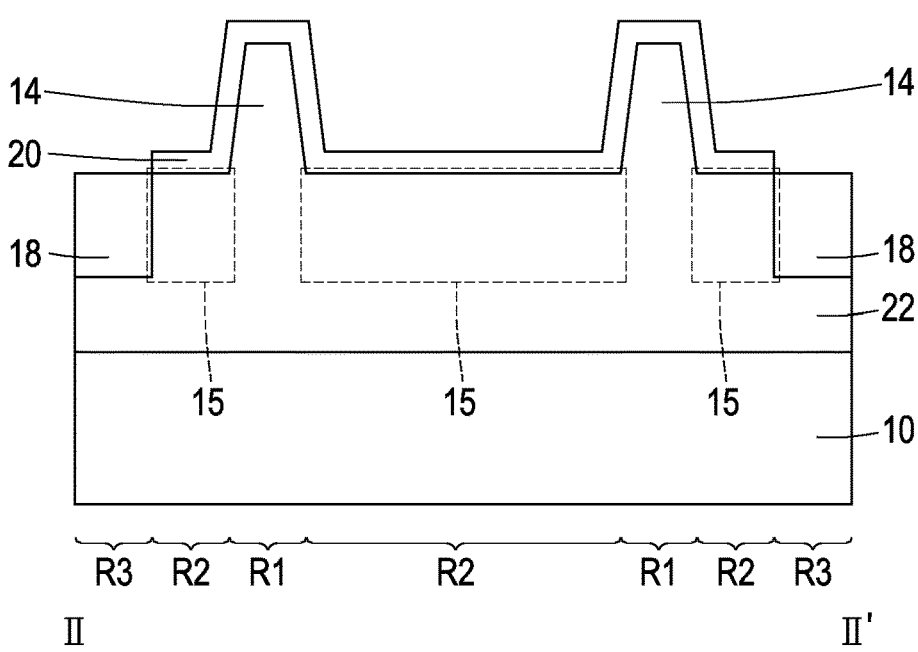
FIG. 6A to FIG. 6D are cross-sectional views along a line II-II' of FIG. 1B to FIG. 1E.

Next, referring to FIG. 1B, FIG. 5A, and FIG. 6A, a dielectric layer 20 is formed above the substrate 10. The dielectric layer 20 may be used as an intermediate layer or a part of the gate dielectric layer. The dielectric layer 20 is, for example, a silicon oxide layer, and the method of forming is, for example, a thermal oxidation method. The dielectric layer 20 covers sidewalls and top surfaces of the fins 14 and the top surfaces of the protruding portions 15. In other embodiments, the dielectric layer 20 may also cover the isolation structure 18 (not shown).

Figure 1C:
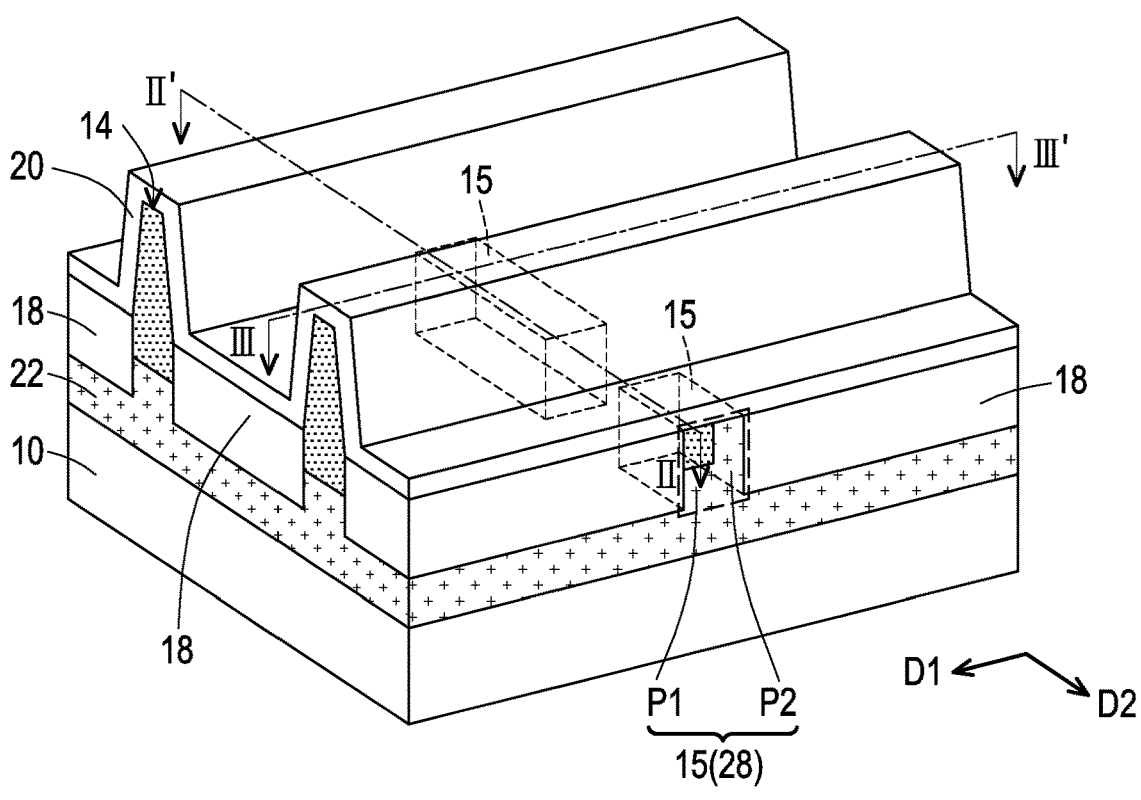
Figure 5B:
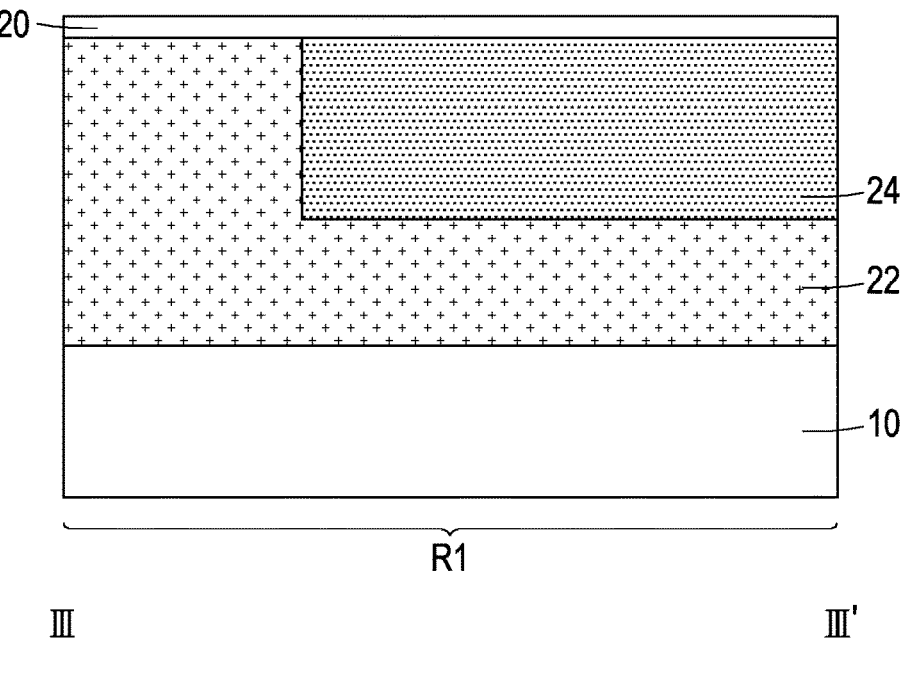
Figure 6B:
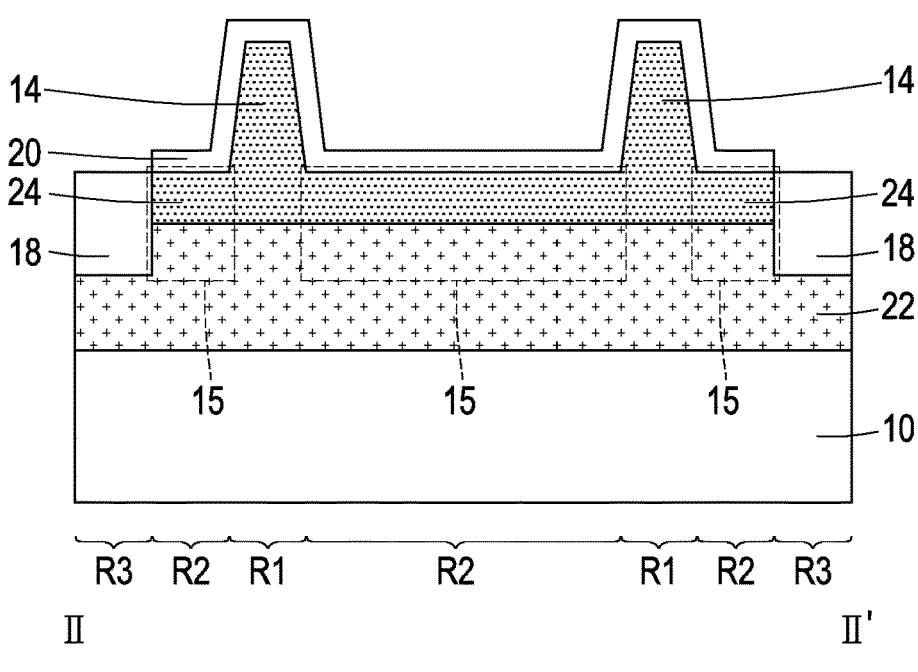

After that, referring to FIG. 1C, FIG. 5B, and FIG. 6B, a well region 22 is formed in the substrate 10, the fin 14, and a first part P1 of the protruding portion 15, and a drift region 24 is then formed in the fin 14 and the well region 22 of the first part P1 of the protruding portion 15. The first part P1 of the protruding portion 15 is closer to a subsequently formed source/drain region 30D (shown in FIG. 1E), and a second part P2 of the protruding portion 15 is closer to a source/drain region 30S (shown in FIG. 1E).

The well region 22 and the drift region 24 have different conductivity types. The well region 22 and the subsequently formed source/drain regions 30S and 30D have different conductivity types. The drift region 24 has the same conductivity type as the subsequently formed source/drain regions 30S and 30D. For example, the well region 22 has a p-type dopant, while the drift region 24 and the source/drain regions 30S and 30D have n-type dopants. The p-type dopant is, for example, boron or boron trifluoride. The n-type dopant is, for example, phosphorus or arsenic.

Figure 1D:
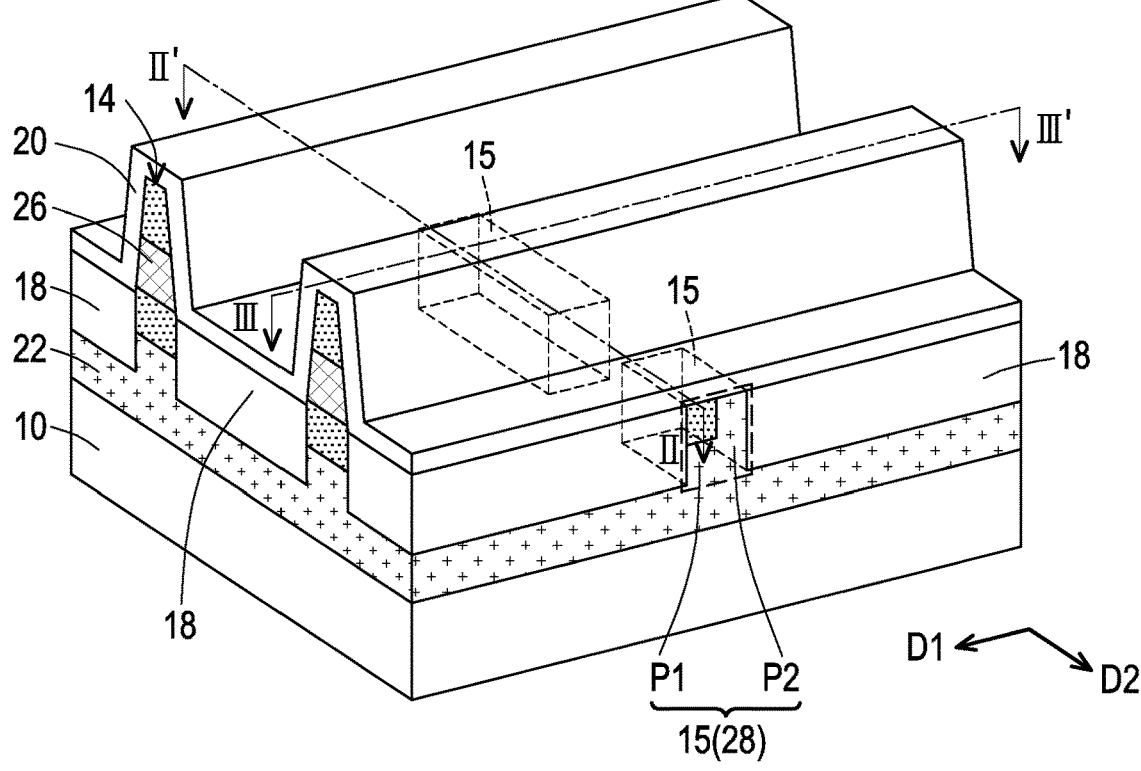
Figure 5C:
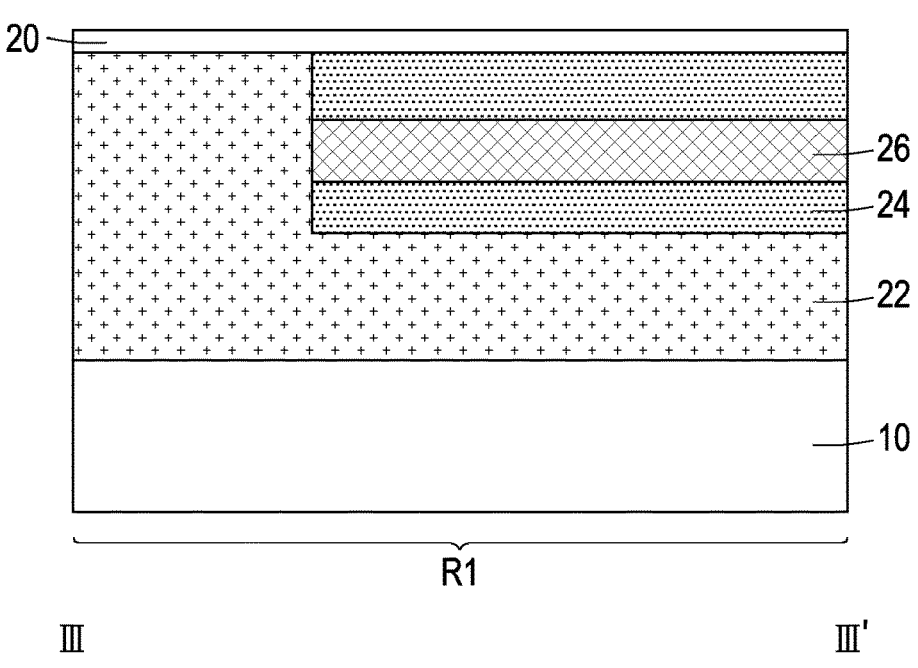
Figure 5D:
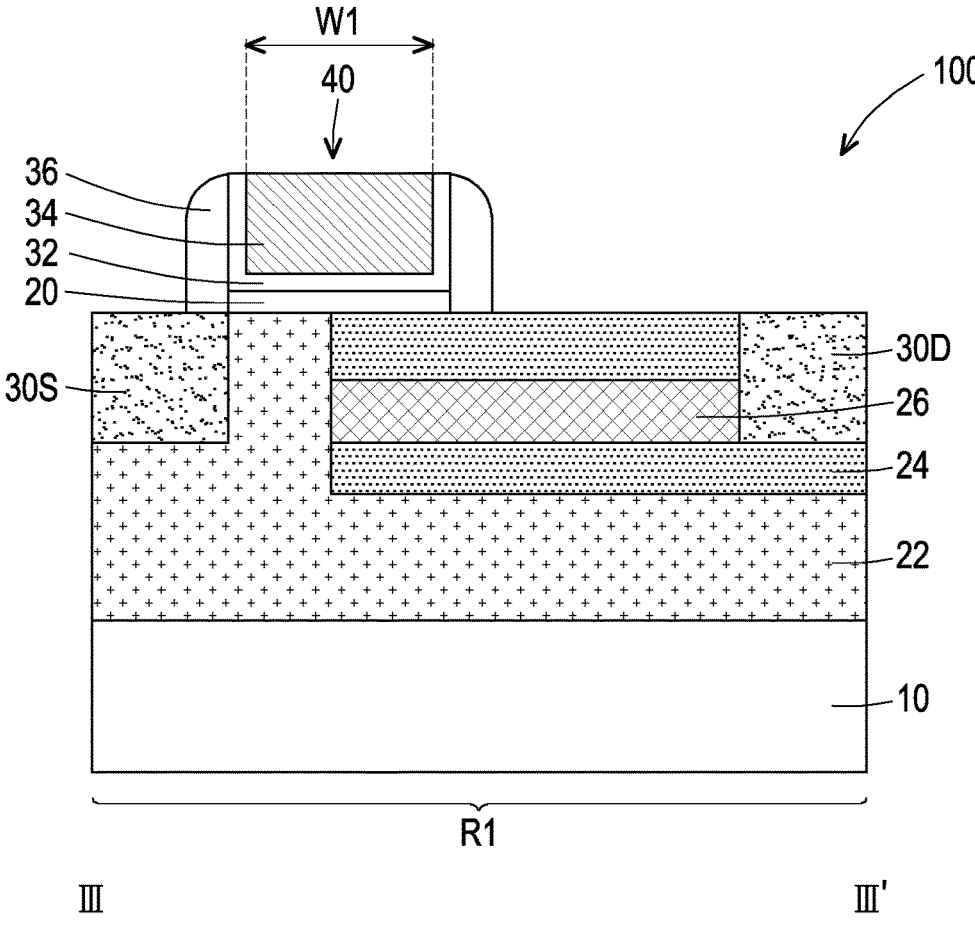
Figure 6C:
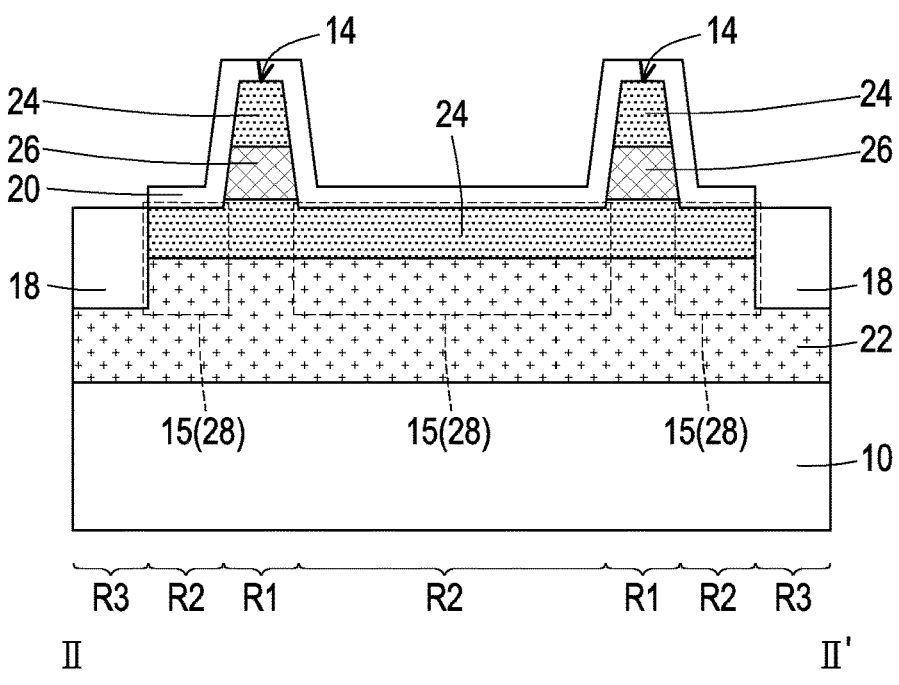

Then, referring to FIG. 1D, FIG. 5C, and FIG. 6C, a doped region 26 is formed in the drift region 24 of the fin 14. The concentration of the doped region 26 is higher than the concentration of the well region 22. The doped region 26 and the drift region 24 have different conductivity types. For example, the source/drain regions 30S and 30D and the drift region 24 have n-type dopants, while the doped region 26 has a p-type dopant. The source/drain regions 30S and 30D and the drift region 24 have p-type dopants, while the doped region 26 has an n-type dopant. In some embodiments, the doped region 26 has a p-type dopant, and the concentration of the p-type dopant is $1 \times 10^{17}/\text{cm}^3$ to $5 \times 10^{19}/\text{cm}^3$. In other embodiments, the doped region 26 has an n-type dopant, and the concentration of the n-type dopant is $1 \times 10^{17}/\text{cm}^3$ to $5 \times 10^{19}/\text{cm}^3$.

The well region 22, the drift region 24, and the doped region 26 may be formed by forming a mask layer (not shown) and performing an ion implantation process. The well region 22, the drift region 24, and the doped region 26 may be simultaneously formed with well regions or doped regions of other regions (for example, logic regions) without requiring extra masks. The doped region 26 may be formed by using the same mask layer as the drift region 24 by performing an ion implantation process of dopants with different conductivity types.

In some embodiments, a doped region may also be selectively formed in the protruding portion 15. The concentration of the doped region is higher than the concentration of the well region 22. The doped region and the drift region 24 have different conductivity types. The doped region may be formed by an ion implantation process using a separately formed mask layer as an implantation mask. The protruding portion 15 with or without the doped region may be referred to as an extra body portion 28. The extra body portion 28 is embedded in the isolation structure 18.

In some embodiments, the depth of a bottom surface of the well region 22 is deeper than a bottom surface of the isolation structure 18, so that the isolation structure 18 and the drift region 24 are both located in the well region 22. The depth of a bottom surface of the drift region 24 is shallower than the bottom surface of the isolation structure 18. The bottom surface of the doped region 26 may be slightly higher than the top surfaces of the protruding portion 15 and the isolation structure 18 or approximately equal to the top surfaces of the protruding portion 15 and the isolation structure 18. In other words, a lower part of the first part P1 of the protruding portion (the extra body portion 28) close to the source/drain region 30D (for example, a drain region) is the well region 22, and an upper part is the drift region 24. The second part P2 of the protruding portion 15 (the extra body portion 28) close to the source/drain region 30S (for example, a source region) is the well region 22.

Figure 1E:
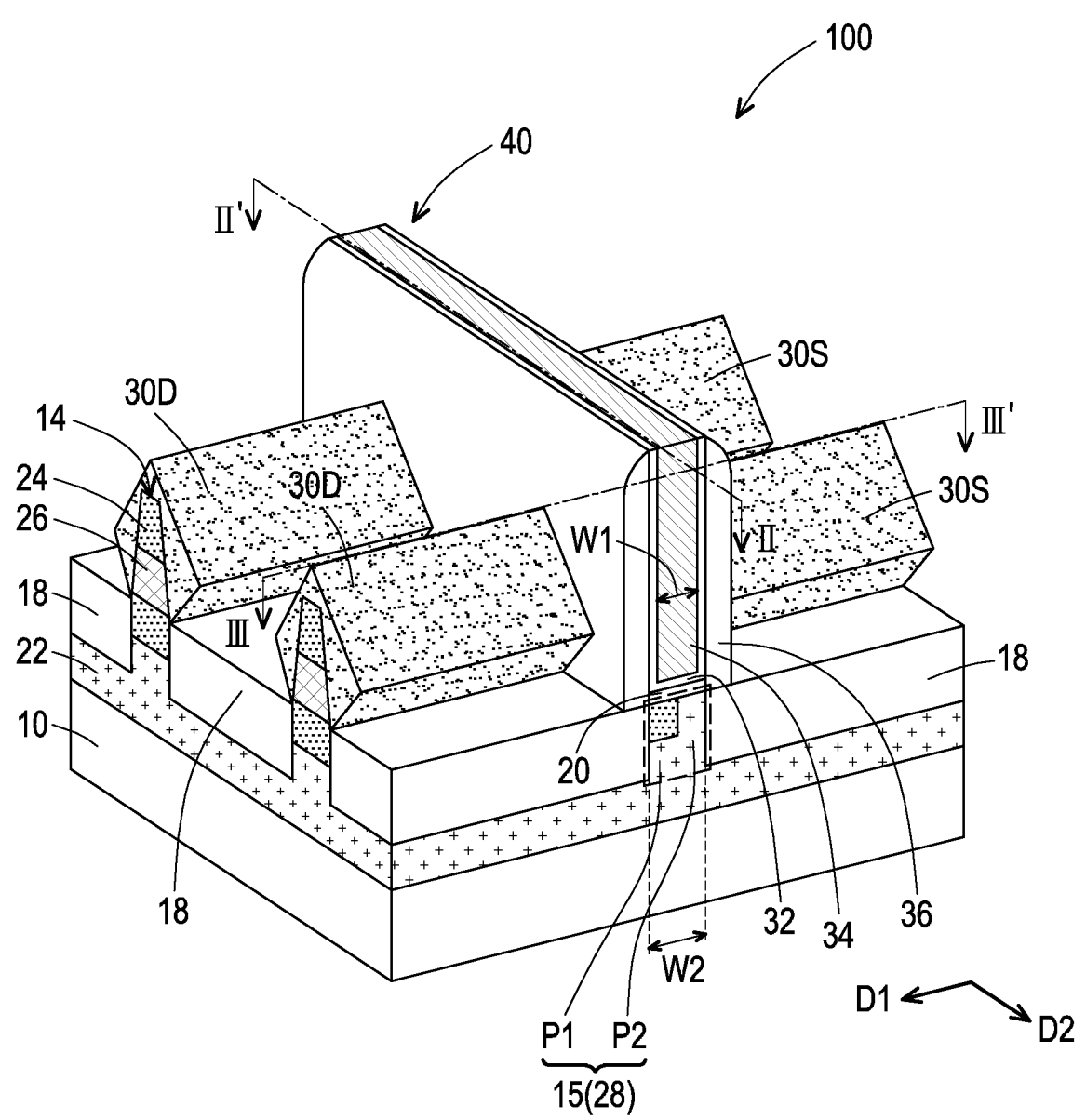
Figure 6D:
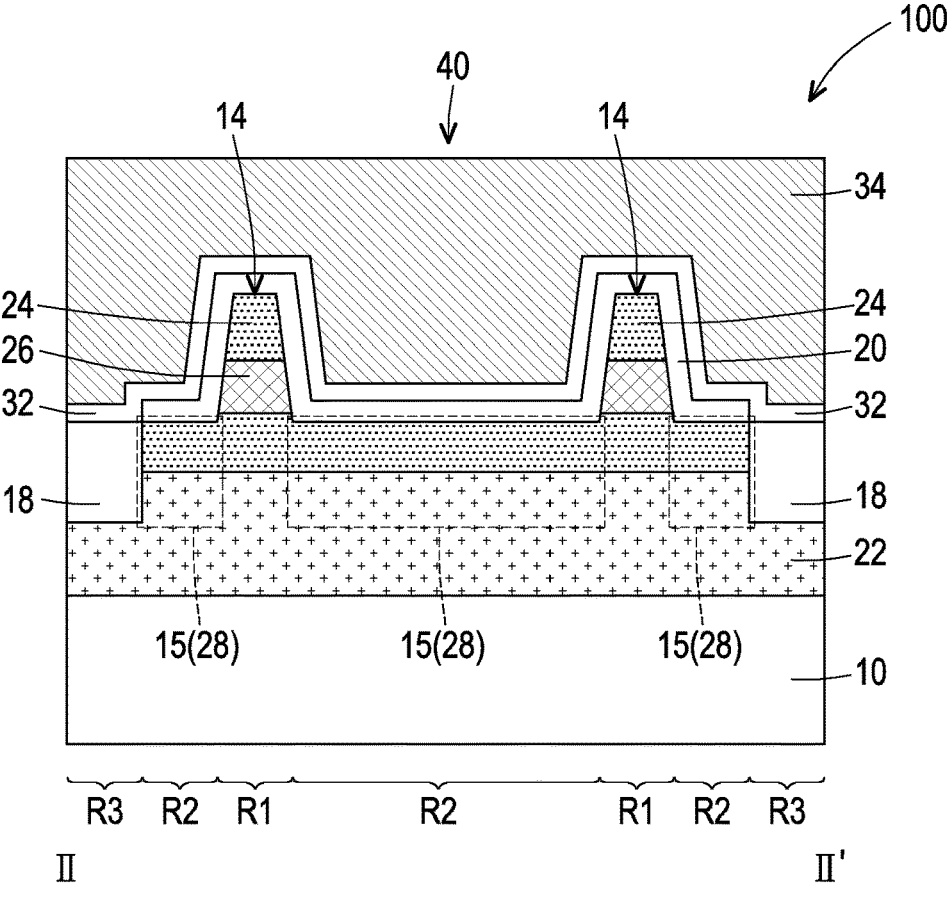

Referring to FIG. 1E, FIG. 5D, and FIG. 6D, the gate structure 40 is formed on the substrate 10. The gate structure 40 may include a gate dielectric layer 32, a gate conductor layer 34, and a spacer 36. The gate dielectric layer 32 is located between the fin 14 and the gate conductor layer 34, and is located between the extra body portion 28 and the gate conductor layer 34.

In some embodiments, the gate structure 40 also includes a capping layer (not shown) located above the gate conductor layer. The gate dielectric layer 32 is, for example, silicon oxide, silicon nitride, or a high dielectric constant material. The gate conductor layer 34 is, for example, doped polysilicon or metal. The gate conductor layer 34 may be a single layer or multiple layers. In some embodiments, the gate conductor layer 34 may include an adhesion layer, a work function layer, a barrier layer, a metal fill layer, or a combination thereof. The capping layer may be a single layer or multiple layers. The capping layer is, for example, silicon oxide, silicon nitride, silicon carbonitride (SiCN), silicon oxycarbonitride (SiOCN), or a combination thereof. The spacer 36 may be a single layer or multiple layers. The spacer 36 is, for example, silicon oxide, silicon nitride, or a combination thereof. The gate structure 40 may be formed by a gate-first process or a gate-last process.

After that, the source/drain regions 30S and 30D are formed in the drift regions 24 on two sides of the gate structure 40. The source/drain regions 30S and 30D may be formed by an epitaxial growth process. The source/drain regions 30S and 30D may have p-type dopants or n-type dopants. So far, the semiconductor device 100 is formed. The semiconductor device 100 may also be referred to as an extended drain metal oxide semiconductor fin-type field effect transistor (EDMOS FinFET). In some embodiments, the semiconductor device 100 is an re-channel EDMOS FinFET. The source/drain regions 30S and 30D have n-type dopants, and an n-type channel may be formed under the device operating gate structure 40. In other embodiments, the semiconductor device 100 is a p-type EDMOS FinFET. The source/drain regions 30S and 30D have p-type dopants, and a p-type channel may be formed under the device operating gate structure 40.

Referring to FIG. 1E, in the embodiment of the disclosure, the gate structure 40 spans the fin 14, spans the protruding portion 15, and overlaps with the protruding portion 15. The gate structure 40 may overlap with the protruding portion 15. The width W1 of the gate conductor layer 34 of the gate structure 40 may be less than or equal to the width W2 of the protruding portion 15. In some embodiments, the width W1 of the gate conductor layer 34 of the gate structure 40 is less than the width W2 of the protruding portion 15, and the gate structure 40 (at least the gate conductor layer 34) may land on the protruding portion 15. The gate structure 40 overlaps with the protruding portion 15, and the conductivity type of the dopant in the doped region in the protruding portion 15 is different from the conductivity type of the dopants in the source/drain regions 30S and 30D, which can have the ability to isolate an electric field, thereby increasing a driving current of a transistor. Furthermore, in the embodiment of the disclosure, the doped region 26 located in the drift region 24 may provide an extra inversion region when the transistor is operating, thereby reducing the electric field of a drain affecting a source and reducing a leakage current. Therefore, the extra body portion and the doped region in the embodiment of the disclosure can improve the performance of the semiconductor device.

What is claimed is:

1. A semiconductor device, comprising:
   a substrate, having an extra body portion and a fin protruding from a top surface of the substrate, wherein the fin extends along a first direction, the extra body portion extends along a second direction different from the first direction, and the extra body portion is only on two sides in the second direction of the fin with an end being connected to the fin;
   a first source/drain region and a second source/drain region, in the fin; and
   a gate structure, spanning the fin, located above the extra body portion, and located between the first source/drain region and the second source/drain region,
   wherein a material of the extra body portion is the same as a material of the substrate.

2. The semiconductor device according to claim 1, wherein the gate structure overlaps with the extra body portion.

3. The semiconductor device according to claim 2, wherein the gate structure lands on the extra body portion.

4. The semiconductor device according to claim 2, wherein a conductivity type of a dopant of the extra body portion is different from a conductivity type of dopants of the first source/drain region and the second source/drain region.

5. The semiconductor device according to claim 1, further comprising:
   a drift region, located between the first source/drain region and the second source/drain region.

6. The semiconductor device according to claim 5, wherein the drift region further extends below the second source/drain region.

7. The semiconductor device according to claim 6, further comprising a doped region embedded in the drift region and adjacent to the second source/drain region.

8. The semiconductor device according to claim 7, wherein a part of the drift region and a part of the doped region are sandwiched between the gate structure and the extra body portion.

9. The semiconductor device according to claim 1, further comprising an isolation structure located on the substrate, wherein the extra body portion is embedded in the isolation structure.

10. The semiconductor device according to claim 9, wherein a top surface of the isolation structure is coplanar with a top surface of the extra body portion.

11. The semiconductor device according to claim 9, wherein the extra body portion and the fin are of a same material as the substrate.

12. The semiconductor device according to claim 9, wherein the gate structure comprises a gate dielectric layer and a gate conductor layer, and the gate dielectric layer is located between the fin and the gate conductor layer, and between the extra body portion and the gate conductor layer.

13. A method of fabricating a semiconductor device, comprising:

providing a substrate;

forming an extra body portion and a fin on the substrate, wherein the extra body portion and the fin protrude from a top surface of the substrate, the fin extends along a first direction, the extra body portion extends along a second direction different from the first direction, and the extra body portion is only on two sides in the second direction of the fin with an end being connected to the fin;forming a first source/drain region and a second source/drain region in the fin; and forming a gate structure spanning the fin, wherein the gate structure is located above the extra body portion and is located between the first source/drain region and the second source/drain region, wherein a material of the extra body portion is the same as a material of the substrate.

14. The method of fabricating the semiconductor device according to claim 13, wherein the gate structure overlaps with the extra body portion.

15. The method of fabricating the semiconductor device according to claim 14, further comprising:

forming a drift region, wherein the drift region is in the fin between the first source/drain region and the second source/drain region and a part of the extra body portion, and the second source/drain region is located in the drift region.

16. The method of fabricating the semiconductor device according to claim 15, further comprising:

forming a doped region in the drift region of the fin and adjacent to the second source/drain region, wherein the doped region and the drift region have different conductivity types.

17. The method of fabricating the semiconductor device according to claim 16, wherein a part of the drift region and a part of the doped region are located between the gate structure and the extra body portion.

18. The method of fabricating the semiconductor device according to claim 14, further comprising forming an isolation structure located on the substrate and adjacent to the extra body portion and the fin.

19. The method of fabricating the semiconductor device according to claim 14, wherein the extra body portion and the fin are formed by etching the substrate.

\* \* \* \* \*